Aug. 6, 1957 W. C. BADDERS 2,802,188

ELECTRICAL SOCKET CONNECTOR FOR PRINTED CIRCUIT BOARDS

Filed Nov. 21, 1955

INVENTOR
W. C. BADDERS
BY John C. Morris
ATTORNEY

United States Patent Office 2,802,188

Patented Aug. 6, 1957

2,802,188

ELECTRICAL SOCKET CONNECTOR FOR PRINTED CIRCUIT BOARDS

William C. Badders, Whippany, N. J., assignor to Bell Telephone Laboratories, Incorporated, New York, N. Y., a corporation of New York Application November 21, 1955, Serial No. 548,146

2 Claims. (Cl. 339—17)

This invention relates to electrical connectors and more specifically to a socket-type connector for printed circuit boards.

The most generally used arrangement for printed circuit board terminations comprises printed terminal strips arranged in parallel spaced-apart relation along one edge of the insulating board. The printed circuit wiring is then interconnected with cables or other circuit elements generally by inserting the board edgewise into a socket-type connector. These connectors generally involve a pretensioned spring member so as to insure satisfactory contact pressure between the connector and the terminal strip on the printed board.

Thus, there is inherently a rather high insertion and withdrawal resistance in connection with installation of a printed board in a socket as a result of the use of such pretensioned or predeflected connectors. This insertion and withdrawal resistance results in considerable wear on the comparatively thin foil terminal strips on the printed boards. In some cases such wear may be sufficient to result in the removal of the terminal strip from the board by the action of installing or removing a board in the conventional socket connector. In addition, difficulties are sometimes experienced where, in an attempt to minimize the insertion and withdrawal resistance, the pretensioning of the connector members is reduced. As a consequence, satisfactory contact pressure may not be attained when printed circuit boards of varying thicknesses are installed.

Therefore, one object of this invention is an improved socket connector for printed circuit boards.

A further object is a socket connector capable of high contact pressures with a printed circuit board while at the same time having little or no insertion and withdrawal resistance to the installation and removal of the board.

In one embodiment of this invention, an insulating member in the shape of a channel contains, in the channel portion, a series of transversely disposed looped spring members having substantially the shape of an M. The spring members may be molded in the insulating member or otherwise securely fixed therein. The metal spring members are arranged to receive a printed circuit board edgewise in the central troughlike portion of the M configuration. These members are so dimensioned as to accept printed circuit boards of standard dimensions without having them contact the side portions of the trough during their insertion. Contact is achieved during insertion of the printed circuit board by inward pressure of the board against the bottom portion of the trough which then springs the side portions of the spring member in a rolling action against the terminal strips on the printed circuit board.

Contrary to the usual arrangement of socket connectors for printed circuit boards, the board is not retained in the socket by the tension of the contact members but is secured in the socket by any of several simple latching arrangements. Upon withdrawal of the board, the contact members in effect roll away from the terminal strips in a reversal of the action produced upon insertion. Thus, the insertion and removal of the board occurs with practically no sliding or wiping action between the metallic contact surfaces.

One feature, therefore, of this invention is the M-shaped looped spring member for contacting the terminal portions of a printed circuit board.

It is another feature of this invention that the M-shaped contact member comprise a central troughlike portion having side portions, spaced apart a distance at least equal to the thickness of the circuit board being accommodated, and upright outer portions which are shaped so as normally to spring bias the side portions apart.

It is a further feature of this invention that the outer upright portions normally be inwardly curved to bias the side portions apart but that this spring bias be removed by downward pressure, as by insertion of the printed circuit board against the central troughlike portion, whereby the spaced-apart side members are deflected toward each other and contact the terminal portions of the printed circuit board wiring.

A better understanding of the invention and its objects and features will be had from the following more detailed description taken in connection with the drawing in which.

Figure 1:
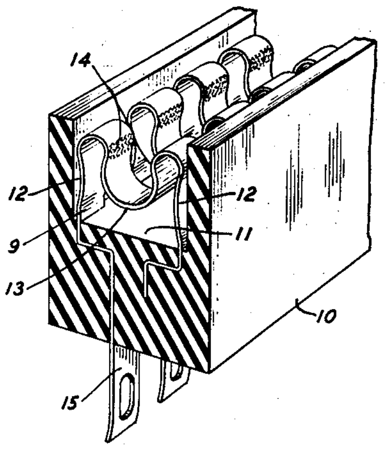
Fig. 1 is a view, partially in section, showing a portion of a socket connector of the single contact type in accordance with this invention.

Referring to Fig. 1, there is shown a portion of an insulating housing member 10 having a longitudinal recess 11, thereby forming a substantially channel-shaped member. Mounted within the recess or channel are a series of looped contact members 9, which, although shown as being molded within the housing member, may be secured by other suitable means, as, for example, by mounting within recesses or apertures formed in the housing member. Each spring metal contact member, which may be typically of beryllium copper or like material, has a configuration substantially like that of an M, having upright portions 12 close to the side walls of the channel and a troughlike portion 13 forming the central section of the M. The side portions 14 of the troughlike section are the contact engaging faces of the connector. Terminal portions 15 of the contact member 9 are arranged to protrude from the opposite side of the housing member 10 to enable the facile making of soldered or other electrical connections thereto. Where oxide films or the like occur on the terminal strips of the printed wiring board, it may be found desirable to roughen the face portions 14 of the spring metal contact member 9 as by knurling or serrating.

Figure 2:
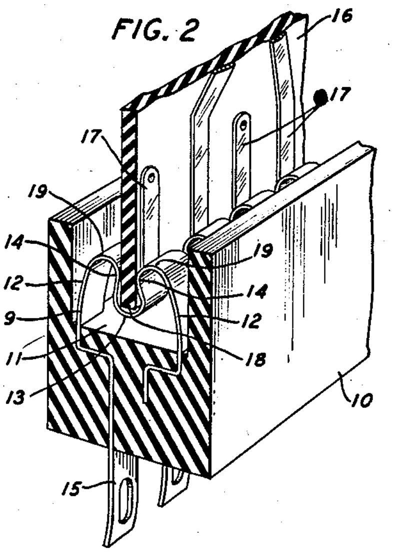
Fig. 2 is a similar view showing a portion of a printed circuit board inserted in the socket.

Fig. 2 shows the socket connector with a printed wiring board inserted therein. A portion of a board 16 is depicted with a series of parallel terminal strips 17 positioned along the lower edge 18. Where appropriate, like reference numbers are used for like elements in both Figs. 1 and 2. As the bottom edge 18 of the printed wiring board bears down against the bottom of the troughlike section 13, the upper loop portions 19 of the contact member are caused to move inwardly, resulting in somewhat of a rolling contact of the face portions 14 of the contact member 9 against the terminal strips 17 on one side of the board and the surface of the board on the other side. It is apparent that this insertion of the board and metal-to-metal contact occurs with practically no sliding or wiping between the metallic contact surfaces. Hence, there is no tendency to produce wear of the terminal strips 17 or to otherwise impair their adherence to the board. In removing the printed circuit board from the socket, the least initial movement effects a release of the spring member 9 so as to cause the upper loop portions 19 to immediately move outwardly, carrying the face portions 14 out of contact with the board 16 and the terminal strips 17.

It will be noted also that within a very small range of insertion depths it will be possible to achieve satisfactory contact pressures with printed boards of slightly varying thicknesses such as commonly occur in commercial supply.

Figures 3, 4:
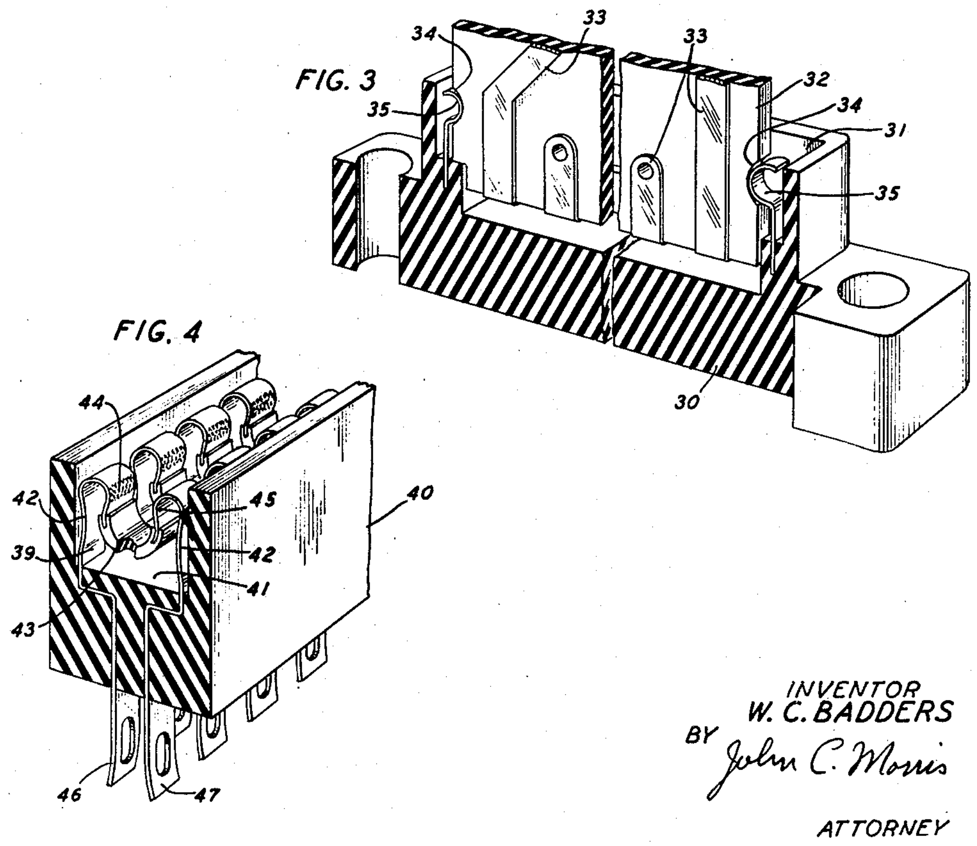
Fig. 3 is a view, partially in section, showing one arrangement of latching means for retaining a printed circuit board in a socket in accordance with this invention.
Fig. 4 is a view, similar to Fig. 1, showing a further embodiment for a double contact type connector in accordance with this invention.

Fig. 3 illustrates a means for retaining a printed circuit board in a socket connector in accordance with this invention. An insulating housing member 30 is shown having a recess portion 31 for receiving a printed circuit board 32. In order to depict the latching feature more clearly, the spring connectors themselves have been omitted. If shown, there would be one in contact with each of the terminal strips 33 on the printed circuit board. Because the contact members of this invention do not act as retaining means for the plugged in board, spring members 35, molded or otherwise secured to the housing member 30, are arranged to act as detents for the board. Thus, when fully inserted the shaped spring members 35 engage similarly shaped recesses 34 in the printed circuit board. It will be apparent that many other variations of this particular arrangement are possible depending on particular manufacturing limitations and dimensional requirements.

A further embodiment of this invention is illustrated in Fig. 4. Within an insulating housing 40 similar to that of the embodiment of Fig. 1, a contact member 39 is arranged to provide separate contacts to the opposite sides of a printed circuit board. This is achieved by the use of an insulating portion 43 between the opposed face portions 44 and 45 of the contact member. Insulating materials having suitably flexibility and strength and capable of being molded to the spring metal member may be used for the central troughlike portion 43. Examples of such materials are neoprene rubber and polyvinyl plastic. Double external terminals 46 and 47 may then be provided on the lower side of the housing member to permit external connection to the separate contact members. The embodiment of Fig. 4 functions in a fashion similar to that previously described, enabling, however, separate contact to directly opposed terminal strips on both sides of the printed circuit board.

While specific embodiments of this invention have been shown and described, it will be understood that they are but illustrative and that various modifications may be made therein without departing from the scope and spirit of the invention.

What is claimed is:

1. An electrical connector for printed circuit boards of the type having terminal strips along an edge thereof comprising a channel member of insulating material, a substantially M-shaped spring metal contact member positioned transversely in said channel member for receiving a printed circuit board, said contact member comprising a pair of spaced-apart upright leg portions mounted from said channel member, inwardly disposed curved portions at the upper end of each said leg portion, and a substantially U-shaped portion connecting the ends of said inwardly disposed curved portions, said inwardly disposed curved portions and said U-shaped portion defining a recess having an opening greater than the thickness of the printed circuit board and wherein said inwardly disposed portions are urged inwardly into contact with the printed circuit board when said board is inserted in said recess and against the bottom of said U-shaped portion.

2. An electrical connector for printed circuit boards of the type having terminal strips along an edge thereof comprising a channel member of insulating material, a substantially M-shaped unitary contact member positioned transversely in said channel member for receiving a printed circuit board, said contact member comprising a pair of spaced-apart upright leg portions mounted from said channel member, inwardly disposed curved portions at the upper end of each said leg portion, and a substantially U-shaped portion of insulating material connecting the ends of said inwardly disposed curved portions, said inwardly disposed curved portions and said U-shaped portion defining a recess having an opening greater than the thickness of the printed circuit board and wherein said inwardly disposed portions are urged inwardly into contact with the printed circuit board when said board is inserted in said recess and against the bottom of said U-shaped portion, and means for retaining said printed circuit board in said connector.

References Cited in the file of this patent

UNITED STATES PATENTS

| | | |
|---|---|---|
| 2,205,316 | Stratton | June 18, 1940 |
| 2,283,040 | Brinkmann et al. | May 12, 1942 |
| 2,403,979 | Hill et al. | July 16, 1946 |
| 2,711,523 | Willis | June 21, 1955 |